United States Patent [19]

Joy et al.

[11] 4,443,532

[45] Apr. 17, 1984

[54] INDUCED CRYSTALLOGRAPHIC MODIFICATION OF AROMATIC COMPOUNDS

[75] Inventors: David C. Joy, Warren; Martin L. Kaplan, Morris Plains; Paul H. Schmidt, Chatham, all of N.J.

[73] Assignee: Bell Telephone Laboratories, Incorporated, Murray Hill, N.J.

[21] Appl. No.: 288,002

[22] Filed: Jul. 29, 1981

[51] Int. Cl.$^3$ .............................................. H01L 29/28
[52] U.S. Cl. ..................................... 430/270; 357/8; 430/272; 430/296
[58] Field of Search ........................ 430/296, 270, 272; 357/8

[56] References Cited

U.S. PATENT DOCUMENTS

| | | | |
|---|---|---|---|
| 3,403,387 | 9/1968 | Boblett | 430/296 |
| 3,871,882 | 3/1975 | Wiedemann | 430/58 |
| 3,904,407 | 9/1975 | Reginsburger | 430/78 |
| 4,312,935 | 1/1982 | Engler | 430/296 |
| 4,312,936 | 1/1982 | Engler | 430/296 |

FOREIGN PATENT DOCUMENTS 2636421 2/1978 Fed. Rep. of Germany .......... 357/8

*Primary Examiner*—John D. Smith
*Attorney, Agent, or Firm*—Bruce S. Schneider

[57] ABSTRACT

Materials that change crystal structure upon radiation with a beam of electrons have been found. These materials, such as perylene dianhydride, naphthalene dianhydride, and perylene tetracarboxylic diimide based compounds undergo a transformation from one crystalline structure to another upon exposure to energetic electrons. This transformation causes a change in optical, electrical, and solubility properties. In this manner, these materials are useful as resists for delineating patterns, as optical storage media, and/or in processes for producing patterns of conductive materials such as employed in semiconductor technology.

13 Claims, No Drawings

INDUCED CRYSTALLOGRAPHIC MODIFICATION OF AROMATIC COMPOUNDS

BACKGROUND OF THE INVENTION

1. Field of the Invention

This invention relates to the interaction of organic materials with energy and, in particular, the interaction of organic materials with electrons.

2. Art Background

Extensive research has been devoted to the study of the interaction of organic materials with energy such as electromagnetic radiation or electron beams. This research shows that irradiation of organic molecular crystals almost invariably leads to a rapid loss of crystallinity followed at higher doses by gross mass loss. A substantial portion of this research has no useful application. For example, Jones et al have discovered a rare instance where a particular organic compound, e.g., p-terphenyl, undergoes a crystalline change when subjected to an electron beam without decomposing into a significantly different compositional phase. (See *Material Research Bulletin*, 10, pp. 1031-1036 (1975).) However, no accompanying change of a useful material property was disclosed to occur.

Although some research concerning the interaction of organic compounds with energy is only of scientific interest, a great deal of practical information has also been generated. For example, the electron lithographic technologies used in the manufacture of semiconductor devices, e.g., silicon based devices, depend on the interaction of an appropriate form of energy with, generally, an organic polymer. Patterns are delineated for the processing of a semiconductor wafer by subjecting an organic coating on the wafer to electrons incident on the polymer in a desired pattern. The electrons produce a chemical change in the polymer coating which allows the preferential solvation and, thus, removal of either the irradiated or nonirradiated portion.

Other uses resulting from the interaction of organic compounds with energy are of interest. For example, the storage of data in a laser readable medium has been investigated. Extensive research continues in areas involving the interaction of organic compounds with energy to improve known processes and to develop new processes.

SUMMARY OF THE INVENTION

Compounds such as 1,4,5,8-naphthalene tetracarboxylic dianhydride, 3,4,9,10-perylene tetracarboxylic dianhydride, and 3,4,9,10-perylene tetracarboxylic diimide undergo a change of crystalline form upon bombardment with an electron beam. These particular compounds are observed to undergo a significant change in properties concomitant with the crystalline change. For example, upon bombardment with electron beams, these materials exhibit a color change, e.g., red to black in the case of 3,4,9,10-perylene tetracarboxylic dianhydride, yellow to black in the case of the 1,4,5,8-naphthalene tetracarboxylic dianhydride and scarlet to black in the case of 3,4,9,10-perylene tetracarboxylic diimide. Additionally, for the dianhydrides the conductivity is modified from that of an insulator to that of a doped semiconductor material. In the case of exposed 3,4,9,10-perylene tetracarboxylic dianhydride moderate photoconductivity behavior also is observed.

Because of these significant property changes, the process of treating these materials with electrons is useful for many applications. For example, it is possible to record data by producing the necessary optical changes, e.g., from red to black in a medium containing the subject material. Alternatively, the formation of conductive portions in semiconductor structures, e.g., portions used to link various areas in an integrated circuit, are fabricated by irradiating these insulators in a desired pattern to produce a corresponding pattern of conducting regions. Since the subject materials after irradiation also have semiconductor properties, rectifying devices are formed when the irradiated materials are contacted with an appropriate interfacing material e.g., materials having metallic conductivity, semiconductor materials, and electrolytes.

DETAILED DESCRIPTION

In a preferred embodiment, 1,4,5,8-naphthalene tetracarboxylic dianhydride i.e., the compound represented by the formula

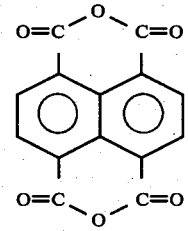

and/or 3,4,9,10-perylene tetracarboxylic dianhydride represented by the formula

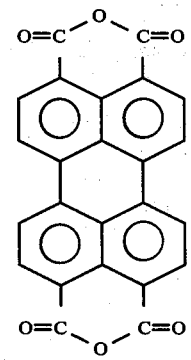

and/or 3,4,9,10-perylene tetracarboxylic diimide represented by the formula

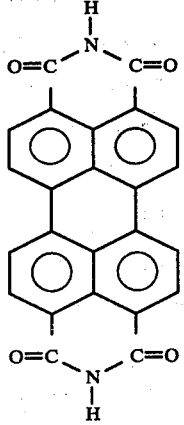

are employed as films on a supporting substrate.

Typically, film thicknesses in the range 0.5 to 5.0 μm are employed. The use of thicker films, i.e., thicker than 5.0 μm generally is uneconomical. However, use of such thick films is possible and is not precluded. Thinner films are generally preferable for applications such as those involved in device fabrication. Films thinner than 0.5 μm generally lead to discontinuous films and to the substantial reduction of the efficiency of the interaction between the material and the energy beam. If imperfections due to discontinuities from inadequate interaction between the film and the electron beam occur in a portion of the film where a delineated pattern is to be formed, obviously the properties of the resulting pattern are degraded.

Films of the subject 1,4,5,8-naphthalene tetracarboxylic dianhydride, 3,4,9,10-perylene tetracarboxylic diimide, and 3,4,9,10-perylene tetracarboxylic dianhydride should be crystalline rather than amorphous in nature, i.e., should upon observation by X-ray diffraction show well-defined peaks. (See C. S. Barrett, *Structure of Metals*, McGraw Hill, New York, 1952, for a general discussion of X-ray diffraction and the spectral configuration which is indicative of a crystalline material.) Preferably, conventional techniques such as sublimation are employed to produce crystalline films. In such a technique, a crucible containing the desired naphthalene or perylene based compound or a mixture of these compounds is placed in a vacuum chamber (evacuated, for example, to $10^{-6}$ Torr) and is electrically heated. (The powder is advantageously confined to the crucible with a material such as quartz wool.) The substrate to be coated, for example, a semiconductor material, e.g., silicon, indium phosphide or a silicon wafer that has been processed to have various layers of conducting semiconducting and/or insulating materials, is mounted in proximity to the heated crucible so that the substrate is in the path of the vapor flow from the crucible. The distance between the substrate and the crucible should be carefully maintained. If the substrate is too close to the crucible, i.e., generally closer than 5 cm, an undersirable material is obtained. If the substrate is further than 15 cm an undesirable material is also obtained. It should be noted that the appropriate distance between the crucible and the substrate varies somewhat with the apparatus used and the particular material being sublimed. A control sample is employed to determine the best spacing for a given material and substrate. The sublimation is continued for a period sufficient to yield the desired film thickness. Typically, for thicknesses as discussed previously, e.g., thicknesses in the range 0.5 to 5 μm, sublimation times in the range 10 seconds to 1.5 minutes are employed. Generally, the temperature employed to cause sublimation is not measured. The crucible is merely raised in temperature until the sublimation of materials is initiated as shown by the appearance of the colored sublimate on the substrate.

As discussed, in one embodiment the films are delineated to have a colored and/or conducting pattern by subjecting them to an electron beam. To produce adequate crystalline change in the film, electron doses in the range 0.05 to 0.4 coulombs/cm$^{-2}$ at dose rates in the range 1 to 10 amps per cm$^2$, preferably 1 to 3 amps per cm$^2$, from electron beams that have been accelerated by potentials in the range 10 to 30 KeV, preferably 20 to 30 KeV, are employed. The exact threshold value for inducing a change in the optical properties or electrical properties of a film varies with the particular compound being employed. A controlled sample is utilized in a particular case to determine the best parameters for a given compound. As previously discussed, the change in optical, electrical and/or solubility properties of the crystalline materials employed is produced by a change in crystal structure. Therefore, by monitoring the crystal structure after exposure with various levels of dosage at various acceleration potentials, the threshold current is easily determined. If the electronic exposure is done on an electron microscope, it is possible to monitor the crystal structure through measuring the electron diffraction pattern of the exposed film and by viewing the secondary electron image on the microscope itself to observe the change as it occurs. Currents and voltages substantially higher than those measured as threshold values generally are not desirable since the properties of the crystalline material formed by the irradiation begin to degrade. For example, in the case of 3,4,9,10-perylene tetracarboxylic dianhydride, the dose and dose rate threshold is about 0.05 coulombs per cm$^2$ and 1 amp per cm$^2$, respectively, at 25 KeV. At substantially higher levels, e.g., of the order 0.5 coulombs per cm$^2$ and 10 amps per cm$^2$, respectively, the material changes from the black color obtained upon irradiation to a white appearing color. (If a white color is desired and the electrical conductivity is irrelevant to the particular application, such higher exposure doses are not precluded.)

Exposure is typically done in a device such as a scanning electron microscope. These devices produce electron beams from a source such as a tungsten filament and collimate these beams with such conventional expedients as electromagnetic or electrostatic lens. The beam typically is controlled to delineate a pattern by conventional techniques such as a flying spot scanner or computer control.

The exposed films for many applications are directly utilized. For example, in the case where a conductive layer surrounded by insulating regions are used in a semiconductor device, no further processing is necessary. Similarly, if the film is used to store data through an optical change, no further processing is necessary. However, it is possible to use the subject dianhydride films as a resist material. Generally, the exposed regions of the film are less soluble than the portions that have not been irradiated. Conventional solvents such as aqueous base are employed to remove the less soluble unexposed regions of the film. For resist applications, it is advantageous to employ electron doses in the range 0.05 to 0.25 coulombs per $cm^2$.

The following examples are illustrative of the conditions utilized in preparing and exposing the subject films.

EXAMPLE 1

A p-type silicon wafer (100 orientation) 3 cm in diameter having a resistivity of 10 ohm/cm was cleaned by sequential ultrasonic treatment with chloroform, acetone, and ethyl alcohol. The wafer was air dried and immersed for 30 seconds in a 25 percent aqueous solution of HF. The wafer was again rinsed with water and then rinsed in ethyl alcohol. The wafer was air dried and after drying mounted immediately in a vacuum apparatus. The apparatus was evacuated using a turbine pump to a pressure of approximately $10^{-6}$ Torr. A tantalum crucible containing approximately 20 mg of 3,4,9,10-perylene tetracarboxylic dianhydride purchased from Aldrich Chemical Company that was previously positioned in the apparatus before evacuation was employed to coat the wafer. A quartz wool plug was inserted on top of the dianhydride to prevent premature discharge of the organic material. The substrate was positioned directly above the crucible and approximately 5 cm from its rim.

The crucible was electrically heated and the heating temperature was increased until a red organic film began to appear on the wafer. When the film appeared, the heating was abruptly terminated. The chamber was backfilled with air and the sample was filled.

The wafer with its coating was mounted with the coating exposed on the sample holder of a scanning electron microscope (ISI Model Super IIIA). The sample which was mounted horizontally was exposed to a 25 KeV electron beam having a current amperage of $1 \times 10^{-8}$. The beam diameter was approximately 1 $\mu$m and the scan rate was approximately 100 msec per point. Various patterns composed of straight lines were exposed with the electron beam. These lines appeared black in color and had a width of approximately 3.5 $\mu$m. Additionally, the black lines showed a significantly higher conductivity than the surrounding unexposed red 3,4,9,10-perylene tetracarboxylic dianhydride.

EXAMPLE 2

The procedure of Example 1 was followed except the crucible contained 3,4,9,10-perylene tetracarboxylic diimide. The film before exposure exhibited a deep red color. The lines produced through electron beam exposure again appeared black. (The diimide was made simply by pouring aqueous $NH_4OH$ over 3,4,9,10-perylene tetracarboxylic dianhydride and boiling the mixture.)

EXAMPLE 3

The procedure of Example 1 was followed except 1,4,5,8-naphthalene tetracarboxylic dianhydride was employed in the crucible. Initially before exposure, the film appeared to be yellow and after exposure black lines were obtained.

EXAMPLE 4

The procedure of Example 1 was followed except approximately a 50/50 by volume mixture of 1,4,5,8-naphthalene tetracarboxylic dianhydride and 3,4,9,10-perylene tetracarboxylic dianhydride was employed in the crucible. The combined film appeared to be red in color and turned black in the exposed areas. Both the material in this example and the diimide exhibited approximately 10 times greater sensitivity than the other materials.

What is claimed is:

1. An exposed energy-sensitive body comprising an energy-sensitive material that has been exposed and that contacts a substrate characterized in that said energy-sensitive material comprises a composition chosen from the group consisting of 1,4,5,8-naphthalene tetracarboxylic dianhydride, 3,4,9,10-perylene tetracarboxylic dianhydride, 3,4,9,10-perylene tetracarboxylic diimide and combinations thereof, wherein at least a portion of said composition has undergone a crystal structure change upon treatment with said energy.

2. An exposed energy-sensitive body comprising an energy-sensitive material that has been exposed and that contacts a substrate characterized in that said substrate comprises a semiconductor material and said energy-sensitive material comprises a composition chosen from the group consisting of 1,4,5,8-naphthalene tetracarboxylic dianhydride, 3,4,9,10-perylene tetracarboxylic dianhydride, 3,4,9,10-perylene tetracarboxylic diimide and combinations thereof, wherein at least a portion of said composition has undergone a crystal structure change upon treatment with said energy.

3. The body of claim 2 wherein said semiconductor material comprises silicon or InP.

4. The body of claim 2 wherein said substrate comprises a silicon device.

5. The product of the process comprising the steps of exposing an energy-sensitive body to energy characterized in that said energy-sensitive body comprises an energy-sensitive material contacting a substrate wherein said energy-sensitive material comprises a composition chosen from the group consisting of 1,4,5,8-naphthalene tetracarboxylic dianhydride, 3,4,9,10-perylene tetracarboxylic dianhydride, 3,4,9,10-perylene tetracarboxylic diimide and combinations thereof, whereby said energy-sensitive material undergoes a crystal structure change upon treatment with said energy.

6. The product of claim 5 wherein said substrate comprises a semiconductor material.

7. The product of claim 6 wherein said semiconductor material comprises silicon or InP.

8. The product of claim 6 wherein said substrate comprises a silicon device.

9. The process comprising the steps of exposing an energy-sensitive body to energy wherein said energy-sensitive body comprises an energy-sensitive material contacting a substrate characterized in that said energy-sensitive material comprises a composition chosen from the group consisting of 1,4,5,8-naphthalene tetracarboxylic dianhydride, 3,4,9,10-perylene tetracarboxylic dianhydride, 3,4,9,10-perylene tetracarboxylic diimide, and combinations thereof, whereby said composition undergoes a crystal structure change upon treatment with said energy.

10. A process for producing an exposed energy-sensitive body comprising the steps of subjecting said energy-sensitive body to energy which produces a crystal structure change characterized in that said energy-sensitive body comprising an energy-sensitive material contacting a substrate, said energy-sensitive material comprises a composition chosen from the group consisting of 1,4,5,8-naphthalene tetracarboxylic dianhydride, 3,4,9,10-perylene tetracarboxylic dianhydride, 3,4,9,10-perylene tetracarboxylic diimide and combinations thereof, wherein at least a portion of said composition has undergone a crystal structure change upon treatment with said energy.

11. The process of claim 10 wherein said substrate comprises a semiconductor material.

12. The process of claim 11 wherein said semiconductor material comprises silicon or InP.

13. The process of claim 11 wherein said substrate comprises a silicon device.

* * * * *

UNITED STATES PATENT AND TRADEMARK OFFICE
CERTIFICATE OF CORRECTION

PATENT NO. : 4,443,532

DATED : April 17, 1984

INVENTOR(S) : David C. Joy, Martin L. Kaplan, and Paul H. Schmidt

It is certified that error appears in the above-identified patent and that said Letters Patent is hereby corrected as shown below:

Column 5, line 41, "3.5 µm" should read --0.5 µm--.

Signed and Sealed this

Ninth Day of October 1984

[SEAL]

Attest:

GERALD J. MOSSINGHOFF

*Attesting Officer*  *Commissioner of Patents and Trademarks*